(12) United States Patent
Tsukada et al.

(10) Patent No.: US 11,236,439 B2
(45) Date of Patent: Feb. 1, 2022

(54) NON-POLAR OR SEMI-POLAR GAN WAFER

(71) Applicant: MITSUBISHI CHEMICAL CORPORATION, Tokyo (JP)

(72) Inventors: Yusuke Tsukada, Tokyo (JP); Masayuki Tashiro, Tokyo (JP); Hideo Namita, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 73 days.

(21) Appl. No.: 16/583,759

(22) Filed: Sep. 26, 2019

(65) Prior Publication Data

US 2020/0032420 A1    Jan. 30, 2020

Related U.S. Application Data

(60) Division of application No. 15/861,269, filed on Jan. 3, 2018, now abandoned, which is a continuation of
(Continued)

(30) Foreign Application Priority Data

Jul. 14, 2015 (JP) ............................. JP2015-140701

(51) Int. Cl.
*C30B 29/40* (2006.01)
*H01L 21/02* (2006.01)
(Continued)

(52) U.S. Cl.
CPC ............ *C30B 29/406* (2013.01); *C30B 7/105* (2013.01); *C30B 25/18* (2013.01); *C30B 33/00* (2013.01);
(Continued)

(58) Field of Classification Search
CPC ....... C30B 25/18; C30B 29/406; C30B 33/00; C30B 7/105; H01L 21/02389;
(Continued)

(56) References Cited

U.S. PATENT DOCUMENTS

2008/0057608 A1* 3/2008 Ishibashi ................. C30B 33/00
                                                                    438/42
2008/0308906 A1 12/2008 Osada et al.
(Continued)

FOREIGN PATENT DOCUMENTS

JP    2006-315947 A    11/2006
JP    2008-143772 A     6/2008
(Continued)

OTHER PUBLICATIONS

Japanese Office Action dated Feb. 25, 2020 for the corresponding Japanese Patent Application No. 2017-528316.
(Continued)

*Primary Examiner* — Hua Qi
(74) *Attorney, Agent, or Firm* — Element IP, PLC

(57) ABSTRACT

A method for producing a GaN crystal is provided. In the method, front surfaces of a plurality of tiling GaN seeds closely arranged side by side on a flat surface of a plate are planarized. An aggregated seed is formed by arranging the tiling GaN seeds closely side by side on a susceptor of an HVPE apparatus in the same arrangement as when fixed on the plate, with the front planarized surfaces facing upward. A bulk GaN crystal is grown epitaxially on the aggregated seed by an HVPE method.

8 Claims, 12 Drawing Sheets

Related U.S. Application Data application No. PCT/JP2016/064969, filed on May 20, 2016.

(51) Int. Cl.
   *C30B 7/10* (2006.01)
   *C30B 25/18* (2006.01)
   *C30B 33/00* (2006.01)
   *H01L 29/04* (2006.01)
   *H01L 29/20* (2006.01)

(52) U.S. Cl.
   CPC ...... *H01L 21/0254* (2013.01); *H01L 21/0262* (2013.01); *H01L 21/02389* (2013.01); *H01L 21/02433* (2013.01); *H01L 21/02609* (2013.01); *H01L 21/02639* (2013.01); *H01L 29/045* (2013.01); *H01L 29/2003* (2013.01)

(58) Field of Classification Search
   CPC ........... H01L 21/02433; H01L 21/0254; H01L 21/02609; H01L 21/0262; H01L 21/02639; H01L 29/045; H01L 29/2003
   See application file for complete search history.

(56) References Cited

U.S. PATENT DOCUMENTS

| | | | |
|---|---|---|---|
| 2009/0236694 A1 | 9/2009 | Mizuhara et al. | |
| 2012/0031324 A1* | 2/2012 | Hiromura | H01L 21/0262 117/94 |
| 2012/0112320 A1* | 5/2012 | Kubo | C30B 25/18 257/615 |
| 2012/0329245 A1 | 12/2012 | Uematsu et al. | |
| 2013/0264606 A1* | 10/2013 | Kubo | C30B 29/403 257/103 |
| 2014/0065360 A1 | 3/2014 | D'Evelyn et al. | |
| 2015/0361587 A1 | 12/2015 | Mikawa et al. | |
| 2016/0233306 A1 | 8/2016 | Nagao et al. | |
| 2016/0319460 A1 | 11/2016 | Tsukada et al. | |

FOREIGN PATENT DOCUMENTS

| | | |
|---|---|---|
| JP | 2009-152511 A | 7/2009 |
| JP | 2010-275171 A | 12/2010 |
| JP | 2011-026181 A | 2/2011 |
| WO | WO-2014/129544 A1 | 8/2014 |
| WO | WO-2015/020161 A1 | 2/2015 |
| WO | WO-2015/107813 A1 | 7/2015 |

OTHER PUBLICATIONS

Po Shan Hsu, et al., "Stress relaxation and critical thickness for misfit dislocation formation in (1010) and (3031) InGaN/GaN heteroepitaxy", *Applied Physics Letters 100*, 2012, pp. 171917-1-171917-4.

International Search Report dated Aug. 2, 2016 for the corresponding PCT Application No. PCT/JP2016/064969.

International Preliminary Report on Patentability dated Jan. 25, 2018 for the corresponding International Application No. PCT/JP2016/064969.

\* cited by examiner

NON-POLAR OR SEMI-POLAR GAN WAFER

CROSS-REFERENCE TO RELATED APPLICATION

This application is a divisional of U.S. patent application Ser. No. 15/861,269, filed Jan. 3, 2018, now abandoned, which is a continuation of International Application PCT/JP2016/064969, filed on May 20, 2016, which designated the U.S., and claims priority from Japanese Patent Application 2015-140701 which was filed on Jul. 14, 2015, the contents of which are incorporated herein by reference in their respective entireties.

TECHNICAL FIELD

The present invention relates to a non-polar or semi-polar GaN (gallium nitride) wafer. A GaN wafer herein refers to a freestanding GaN wafer formed only of GaN, unless otherwise noted.

BACKGROUND ART

GaN is one of group III-V compound semiconductors and has a wurtzite crystal structure belonging to hexagonal crystal systems.

By doping with an impurity, GaN can be made conductive. Examples of known n-type impurities include O (oxygen), Si (silicon), and Ge (germanium). Examples of known p-type impurities include Mg (magnesium) and Zn (zinc). Some impurities exemplified by Fe (iron) are used to make GaN into an insulator having a high resistance.

A non-polar or semi-polar GaN wafer having a main surface with a large tilt relative to the C-plane is promising as a substrate for nitride semiconductor devices with improved characteristics (Non-Patent Document 1). Nitride semiconductors are also referred to as, for example, nitride-based Group III-V compound semiconductors, group III nitride compound semiconductors, and GaN-based semiconductors, and include, in addition to GaN, a compound in which Ga in GaN is partially or fully substituted with another Group 13 element (B, Al, and In) in the periodic table. Examples of such a compound include AlN, InN, AlGaN, AlInN, GaInN, and AlGaInN.

Among non-polar GaN wafers, (10-10) wafers, namely M-plane wafers have especially attracted attention. Among semi-polar GaN wafers, (20-21) wafers, (20-2-1) wafers, (30-31) wafers, and (30-3-1) wafers have especially attracted attention.

A non-polar or semi-polar GaN wafer can be produced by a method in which a bulk GaN crystal grown on the GaN (0001) surface of a C-plane GaN wafer or C-plane GaN template by a Hydride Vapor Phase Epitaxy (HVPE) method is sliced parallel to a desired non-polar or semi-polar plane. However, the thickness of a GaN crystal stably growable on the GaN (0001) surface by vapor phase epitaxy is usually several millimeters or less; therefore, a non-polar or semi-polar GaN wafer made by this method has a limited area. It is extremely difficult to industrially manufacture large-area wafers such as a 2-inch wafer (a disk-shaped wafer having a diameter of about 50 mm) by this method.

To solve this problem, a tiling method has been devised. In the tiling method, an aggregated seed is used. The aggregated seed is formed by closely arranging side by side a plurality of seeds in a manner to have uniform crystal orientation. On the aggregated seed formed of the plurality of seeds, a bulk GaN crystal forming a single continuous layer is epitaxially grown by an HVPE method (Patent Documents 1 to 4). By using an aggregated seed formed by gathering a plurality of M-plane GaN wafers each having a main surface with a size of as small as several millimeters in the c-axis direction, an M-plane GaN wafer having a diameter of about 50 mm is able to be realized.

An ammonothermal method is known as one of methods enabling growth of a high-quality GaN crystal with less defects such as dislocation (Patent Document 5). In the ammonothermal method, ammonia in a supercritical or subcritical state is used as a solvent to precipitate a GaN single crystal on a seed.

PRIOR ART DOCUMENT

Patent Document

Patent Document 1: JP-A-2006-315947
Patent Document 2: JP-A-2008-143772
Patent Document 3: JP-A-2010-275171
Patent Document 4: JP-A-2011-026181
Patent Document 5: WO2014/129544

Non-Patent Document

Non-Patent Document 1: Po Shan Hsu, Matthew T. Hardy, Erin C. Young, Alexey E. Romanov, Steven P. DenBaars, Shuji Nakamura, and James S. Speck, Applied Physics Letters 100, 171917 (2012)

SUMMARY OF INVENTION

Problem to be Solved by Invention

In a bulk GaN crystal grown by a tiling method, a portion grown above the boundary between adjacent seeds has lower crystallinity. A non-polar or semi-polar GaN wafer produced by slicing such a GaN crystal has, on a main surface thereof, a lower-crystallinity band which is an area where the above-described portion having lower crystallinity is exposed in a band-shape.

When the non-polar or semi-polar GaN wafer having the lower-crystallinity band on a main surface thereof is used to produce a nitride semiconductor device, an element formed right above the lower-crystallinity band would be inferior to another element formed on other portion of the same wafer in terms of characteristics and reliability. Thus, if a reduction in the width of the lower-crystallinity band is achieved, yields of nitride semiconductor devices produced by using the non-polar or semi-polar GaN wafer would be improved.

Accordingly, it is a main object of the present invention to provide a non-polar or semi-polar GaN wafer in which a lower-crystallinity band present on a main surface has a reduced width.

Solution to Problem

Aspects of the present invention include a GaN wafer described below.
(1) A GaN wafer including: a first main surface; a second main surface on a side opposite to the first main surface; and a lower-crystallinity band extending on the first main surface in a direction perpendicular to a c-axis, wherein the first main surface is parallel to or tilted relative to an M-plane, when the tilt, if exists, is decomposed into an a-axis direction component and a c-axis direction component, the a-axis direction component has an absolute value of 5° or less while the c-axis direction component has an absolute value of 45° or less, and the lower-crystallinity band has a width of less than 190 μm.

(2) The GaN wafer according to (1), wherein the lower-crystallinity band has a width of less than 150 μm.

(3) The GaN wafer according to (2), wherein the lower-crystallinity band has a width of less than 120 μm.

(4) The GaN wafer according to any one of (1) to (3), wherein X-ray rocking curve full width at half maximums of a (100) plane measured in an area distant from an outer periphery by 3 mm or more on the first main surface are less than 0.01°, except in the lower-crystallinity band.

(5) The GaN wafer according to any one of (1) to (4), wherein the GaN wafer is a {10-10} wafer, a {10-11} wafer, a {10-1-1} wafer, a {20-21} wafer, a {20-2-1} wafer, a {30-31} wafer or a {30-3-1} wafer.

(6) The GaN wafer according to any one of (1) to (5), wherein the GaN wafer is a disk having a diameter of from 45 to 55 mm, and the number of the lower-crystallinity band the GaN wafer has on the first main surface is one or greater and three or smaller.

(7) The GaN wafer according to any one of (1) to (5), further including a lower-crystallinity band extending on the first main surface in a direction perpendicular to an a-axis.

(8) The GaN wafer according to (7), wherein the GaN wafer is a disk having a diameter of from 95 to 155 mm.

(9) A method for producing a nitride semiconductor device, including: preparing the GaN wafer according to any one of (1) to (8); and growing one or more nitride semiconductors on the prepared GaN wafer by vapor phase epitaxy to form a device structure.

Effect of the Invention

A non-polar or semi-polar GaN wafer in which a lower-crystallinity band present on a main surface has a reduced width is provided.

BRIEF DESCRIPTION OF THE DRAWINGS

FIG. 12A illustrates the arrangement when viewed from a direction parallel to a main surface of the GaN wafer and perpendicular to a plane of incidence of X-rays while FIG. 12B illustrates the arrangement when viewed from a direction perpendicular to the main surface of the GaN wafer.

DESCRIPTION OF EMBODIMENTS

In a GaN crystal, a crystal axis parallel to [0001] and [000-1] is referred to as a c-axis, a crystal axis parallel to <10-10> is referred to as an m-axis, and a crystal axis parallel to <11-20> is referred to as an a-axis. In addition, a crystal plane perpendicular to the c-axis is referred to as a C-plane, a crystal plane perpendicular to the m-axis is referred to as an M-plane, and a crystal plane perpendicular to the a-axis is referred to as an A-plane.

Herein, when crystal axes, crystal planes, crystal orientations, and the like are mentioned, they mean crystal axes, crystal planes, crystal orientations, and the like of a GaN crystal, unless otherwise specified.

A name or Miller indices of a crystal plane which is attached to a name of a GaN wafer is that of a low-index plane which is parallel or closest to parallel to, out of two main surfaces of the wafer, the main surface that is on the side intended to be used for forming a semiconductor device and/or epitaxially growing a crystal.

For example, a GaN wafer in which a low-index plane parallel or closest to parallel to such a main surface is the M-plane, or in other words, {10-10}, is referred to as an M-plane wafer or a {10-10} wafer.

Usually, a crystal plane for which all of the absolute values of integers h, k, m, and l of Miller indices {hkml} are smaller than or equal to 3 is assumed to be a low-index plane.

1. First Embodiment

A first embodiment of the present invention relates to a GaN wafer.

Figure 1:
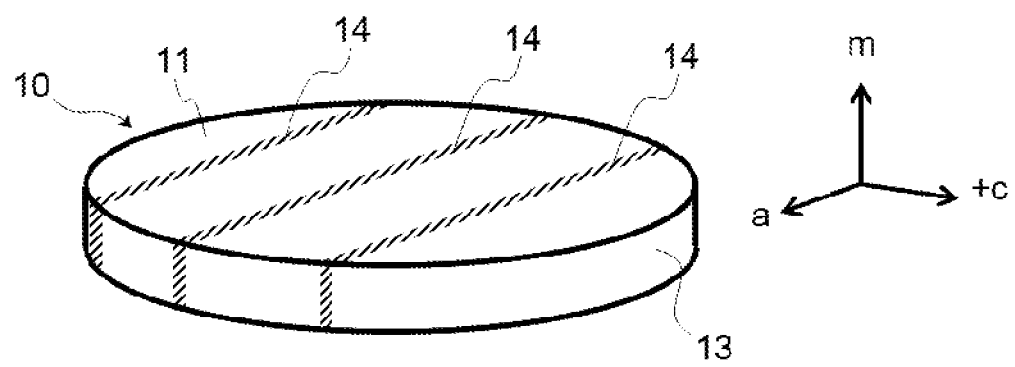
FIG. 1 is a perspective view illustrating an example of an M-plane GaN wafer according to a first embodiment.
Figure 2A:
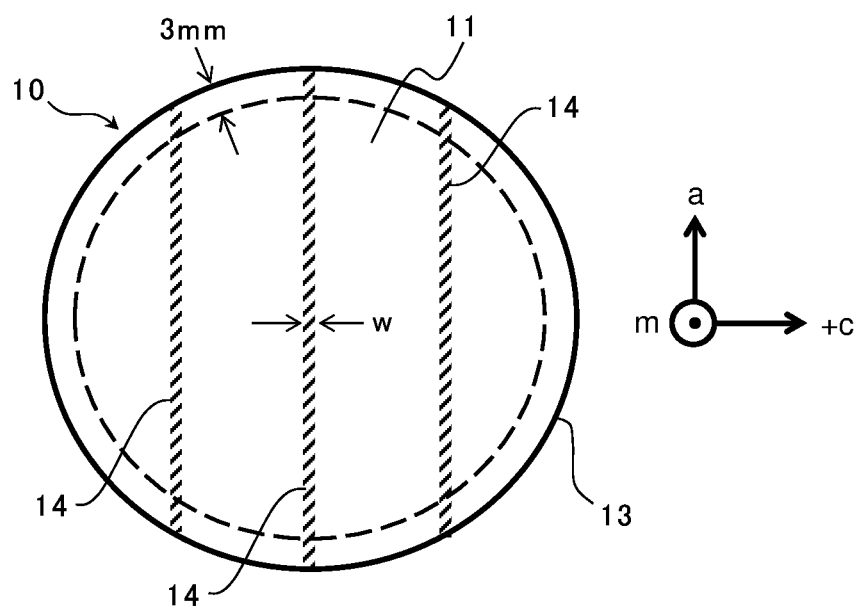
FIG. 2A is a plan view of the M-plane GaN wafer illustrated in FIG. 1.
Figure 2B:
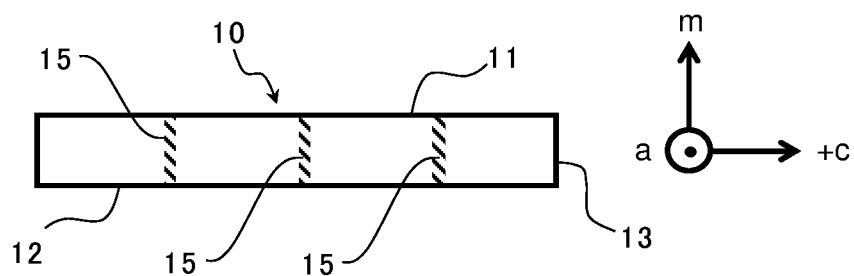
FIG. 2B is a cross-sectional view of the M-plane GaN wafer illustrated in FIG. 1.

FIG. 1 is a perspective view illustrating an example of a GaN wafer according to the first embodiment. FIG. 2A is a plan view of the GaN wafer 10 illustrated in FIG. 1. FIG. 2B is a cross-sectional view of the GaN wafer 10 illustrated in FIG. 1 and illustrates a cross section formed by cutting the wafer along a plane perpendicular to the a-axis.

Referring to FIGS. 1, 2A and 2B, the GaN wafer 10 is an M-plane wafer having a shape of a disk, and has a first main surface 11 and a second main surface 12 which is on a side opposite to the first main surface. The first main surface 11 and the second main surface 12 are connected to each other via a side surface 13. Preferably, the first main surface 11 and the second main surface 12 are parallel to each other.

The first main surface 11 is a main surface intended to be used for forming a nitride semiconductor device and/or epitaxially growing a GaN crystal, and finished to be a flat surface suitable for these purposes. For example, a root-mean-square (RMS) roughness of the first main surface 11 measured by AFM is usually less than 5 nm, preferably less than 2 nm, more preferably less than 1 nm in a measured area of 10 μm×10 μm.

The first main surface 11 may be tilted relative to the M-plane by a maximum of about 5°. The direction of the tilt is not limited and preferably such that when the tilt of the first main surface 11 from the M-plane is decomposed into a c-axis direction component and an a-axis direction component, the absolute value of the c-axis direction component is greater than the absolute value of the a-axis direction component.

Figure 11:
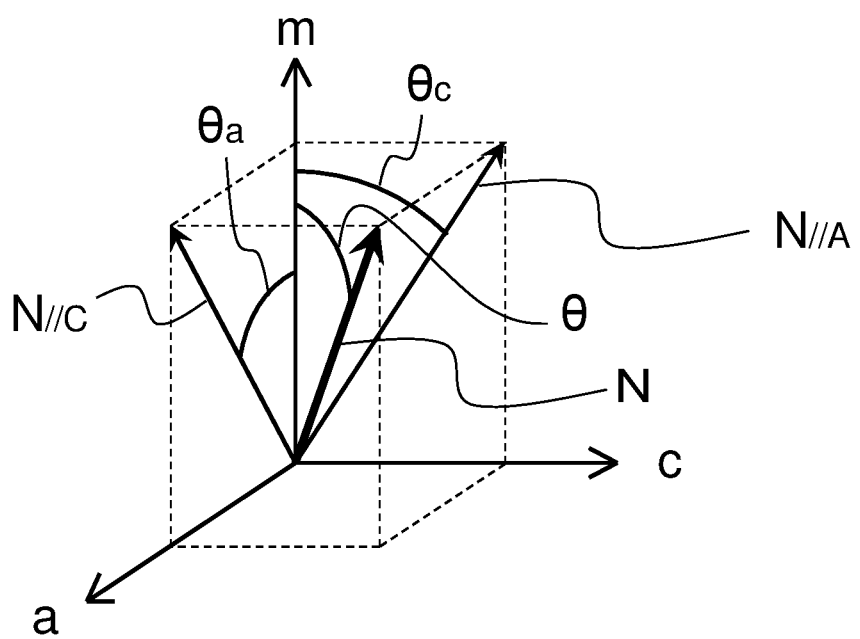
FIG. 11 is a drawing illustrating the relationship between a tilt θ of a main surface of a GaN wafer from the M-plane and a c-axis direction component θc and an a-axis direction component θa of the tilt θ.

The relationship between a tilt of a main surface of a GaN wafer from the M-plane and a c-axis direction component and an a-axis direction component of the tilt is as illustrated in FIG. 11.

A tilt of a main surface of a GaN wafer from the M-plane is in other words a tilt θ of a normal vector N of the main surface from the m-axis. In order for the tilt θ to be decomposed into a c-axis direction component and an a-axis direction component, the normal vector N is decomposed into an A-plane parallel component $N_{//A}$ and a C-plane parallel component $N_{//C}$. The A-plane parallel component $N_{//A}$ is the orthogonal projection of the normal vector N on the A-plane, and the C-plane parallel component $N_{//C}$ is the orthogonal projection of the normal vector N on the C-plane. The tilt of the A-plane parallel component $N_{//A}$ relative to the m-axis corresponds to a c-axis direction component θc of the tilt θ, and the tilt of the C-plane parallel component $N_{//C}$ relative to the m-axis corresponds to an a-axis direction component θc of the tilt θ.

In a particularly preferable example, the absolute value of the c-axis direction component of the tilt of the first main surface relative to the M-plane is from 2 to 5°, and the absolute value of the a-axis direction component of the tilt is less than 1°. The c-axis direction component may be either positive or negative, and is preferably negative. Here, "the c-axis direction component is positive" means that the A-plane parallel component $N_{//A}$ of the normal vector of the first main surface is tilted relative to the m-axis toward the [0001] side, and "the c-axis direction component is negative" means that the A-plane parallel component $N_{//A}$ of the normal vector of the first main surface is tilted relative to the m-axis toward the [000-1] side.

The GaN wafer 10 is thick enough to be handled as a freestanding wafer. In the case of a disk-shaped GaN wafer having a diameter of from 45 to 55 mm (about 2 inch), the minimum thickness necessary to allow the wafer to be handled as a freestanding wafer is from 150 to 200 μm, a favorable thickness is 250 μm or more, and a further favorable thickness is 280 μm or more. If the wafer has a larger diameter, a favorable thickness is also larger.

While the thickness of the GaN wafer 10 does not have any particular upper limit, the thickness is usually 1 mm or less, and when the diameter is from 45 to 55 mm, the thickness is preferably 400 μm or less.

On the first main surface 11, the GaN wafer 10 has three lower-crystallinity bands 14 each extending in a direction perpendicular to the c-axis. The lower-crystallinity bands are band-shaped areas each comprising a portion in which crystal orientation is disarranged. Dark spot (dislocation) densities on the first main surface 11 are observed to be increased in areas corresponding to the lower-crystallinity bands 14 by CL (Cathode Luminescence) measurement.

The presence of the lower-crystallinity bands 14 indicates that a tiling method was used in the production process of a GaN crystal forming the GaN wafer 10.

As will be described later, a GaN wafer made of a GaN crystal grown by using a tiling method has a lower-crystallinity band on a main surface thereof. In addition, when a GaN wafer having a lower-crystallinity band on a main surface thereof is used as a seed to grow a GaN crystal, a GaN wafer made from the GaN crystal also has a lower-crystallinity band on a main surface thereof.

A full width at half maximum of X-ray rocking curve (XRC-FWHM), which is an index of crystal orientation, greatly changes at the boundaries between a lower-crystallinity band and other areas, and XRC-FWHMs at many portions within a lower-crystallinity band are greater than those in areas outside the lower-crystallinity band.

In the GaN wafer 10, the lower-crystallinity bands 14 on the first main surface 11 each have a width w of usually 190 μm or less, preferably 150 μm or less, more preferably 120 μm or less, more preferably 90 μm or less, more preferably 60 μm or less.

Figures 12A, 12B:
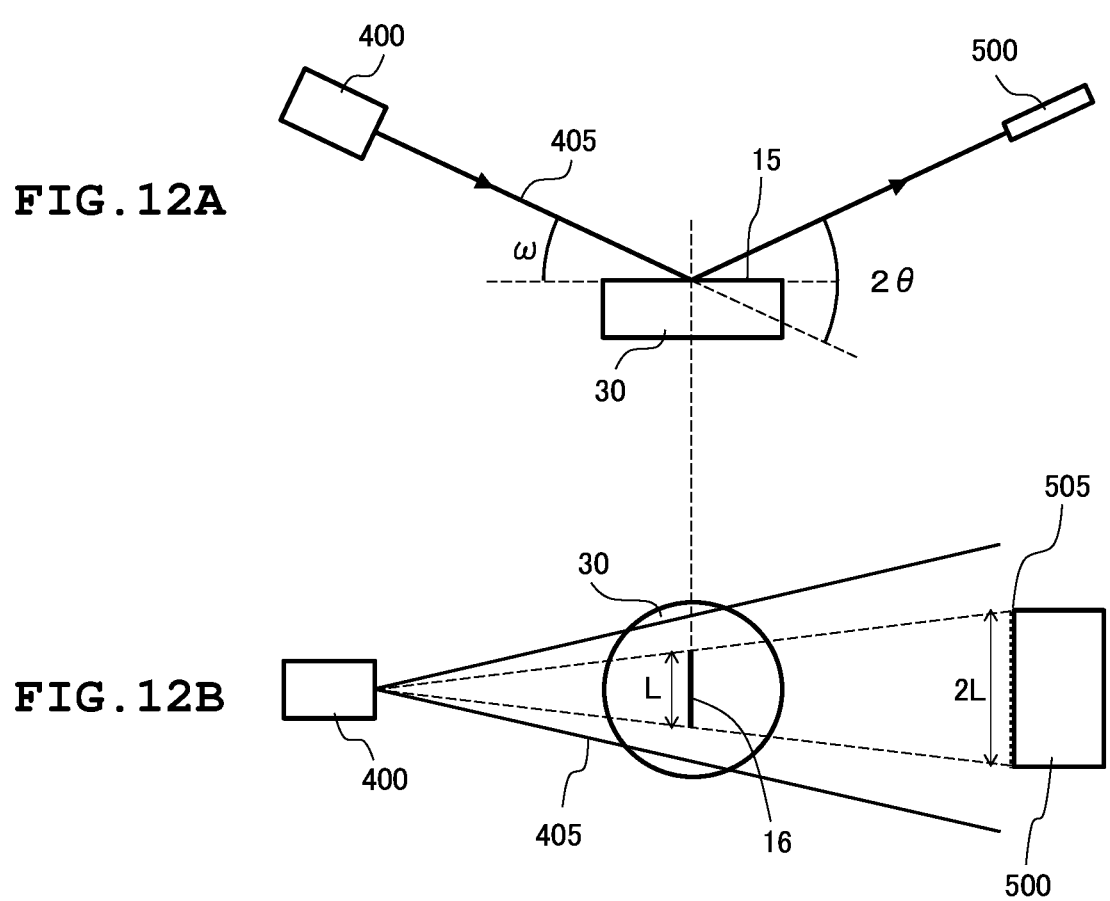
FIGS. 12A and 12B are schematic diagrams each illustrating arrangement of an X-ray source, a GaN wafer, and a detector in X-ray rocking curve measurement.

The width of a lower-crystallinity band a GaN wafer has on a main surface can be examined by X-ray rocking curve measurement using an X-ray diffractometer equipped with a semiconductor pixel detector (for example, PIXcel$^{3D}$® from PANalytical). Arrangement of an X-ray source, a GaN wafer, and a detector in such X-ray rocking curve measurement is schematically illustrated in FIGS. 12A and 12B. FIG. 12A is a drawing illustrating the arrangement when viewed from a direction parallel to a main surface 16 of a GaN wafer 30 and perpendicular to a plane of incidence of X-rays 405, while FIG. 12B is a drawing illustrating the arrangement when viewed from a direction perpendicular to the main surface 16 of the GaN wafer 30.

An X-ray source 400, the GaN wafer 30, and a semiconductor pixel detector 500 are arranged such that at an intermediate position between the X-ray source 400 and the detector 500, the X-rays 405 are incident on the main surface 16 of the GaN wafer 30.

The semiconductor pixel detector 500 has a one-dimensional pixel array 505 in which n pixels each functioning as an X-ray detector are arranged side by side in a row at a constant pitch of 2 L/n. Here, 2 L is the length of the one-dimensional pixel array 505 (distance between one end and the other end of the array). The one-dimensional pixel array may be part of a two-dimensional pixel array. The semiconductor pixel detector 500 is arranged such that the one-dimensional pixel array is perpendicular to the plane of incidence of the X-rays 405.

By single ω scan measurement with the above-described arrangement, it is possible to at once measure X-ray rocking curves at every L/n on one measurement line 17 parallel to the one-dimensional pixel array 505 and having a length L which is half the length of the pixel array.

For example, when using a semiconductor pixel detector with a one-dimensional pixel array comprising 256 pixels arranged side by side in a row at a pitch of 55 μm and having a length of about 14 mm, X-ray rocking curves can be measured at every 27.5 μm on an about 7 mm long measurement line parallel to the pixel array in a single ω scan.

Thus, by performing an ω scan with an X-ray source, a GaN wafer, and a semiconductor pixel detector arranged in such a manner to allow a measurement line to cross a lower-crystallinity band at a right angle, the width of the lower-crystallinity band at a position where the lower-crystallinity band intersects with the measurement line can be examined.

Referring again to FIG. 2A, the number of the lower-crystallinity bands 14 the GaN wafer 10 has on the first main surface 11 is not limited to three and may be four or more, but it is desirable not to exceed six. When the GaN wafer 10 has a diameter of from 45 to 55 mm, the number of the lower-crystallinity bands 14 is preferably two, more preferably one.

The broken line in FIG. 2A indicates the boundary between areas on the first main surface 11, one distant from the outer periphery by less than 3 mm and the other distant from the outer periphery by 3 mm or more. On the first main surface 11, XRC-FWHMs of the (100) plane measured in an area circled by the broken line (that is, the area distant from the outer periphery by 3 mm or more) are preferably less than 0.01°, more preferably 0.008° or less, except in the lower-crystallinity bands 14.

The GaN crystal forming the GaN wafer 10 comprises a GaN crystal grown by an HVPE method and is characterized by having a low alkali metal concentration and a high transparency in a visible short wavelength range. As to alkali metals, each of elements such as Na (sodium) and K (potassium) has a concentration of less than $1\times10^{15}$ $cm^{-3}$. As to the transparency in a visible short wavelength range, an absorption coefficient for light with a wavelength of 450 nm is 2 $cm^{-1}$ or less for example.

The GaN crystal forming the GaN wafer 10 may contain O (oxygen) at a concentration of $5\times10^{17}$ $cm^{-3}$ or more.

The GaN wafers according to the first embodiment may be various modifications of the GaN wafer 10 illustrated in FIGS. 1 and 2.

In one modification, the first main surface of the GaN wafer may have a shape other than a circle and may be shaped into a quadrangle (square, rectangle) for example.

In one modification, the first main surface of the GaN wafer may be tilted relative to the M-plane by an angle exceeding 5°. The direction of the tilt is not limited but preferably such that when the tilt of the first main surface from the M-plane is decomposed into a c-axis direction component and an a-axis direction component, the absolute value of the a-axis direction component is 5° or less, more preferably less than 2°, more preferably less than 1°. The smaller the absolute value of the a-axis direction component is, the more easily a nitride semiconductor thin film with a high surface flatness is grown on the first main surface 11.

On the other hand, the absolute value of the c-axis direction component is usually 45° or less, preferably less than 30°, more preferably less than 20°. When the absolute value of the c-axis direction component exceeds 45°, the merit as a semi-polar wafer tends to be lost. The c-axis direction component may be positive or negative, but preferably negative.

Preferable examples of the GaN wafer having a first main surface tilted relative to the M-plane by an angle exceeding 5° include {10-11} wafers, {10-1-1} wafers, {20-21} wafers, {20-2-1} wafers, {30-31} wafers, and {30-3-1} wafers.

In {10-11} wafers, {20-21} wafers, and {30-31} wafers, the c-axis direction component of the tilt of the main surface relative to the M-plane is positive, while in {10-1-1} wafers, {20-2-1} wafers, and {30-3-1} wafers, the c-axis direction component of the tilt of the main surface relative to the M-plane is negative.

Figure 3:
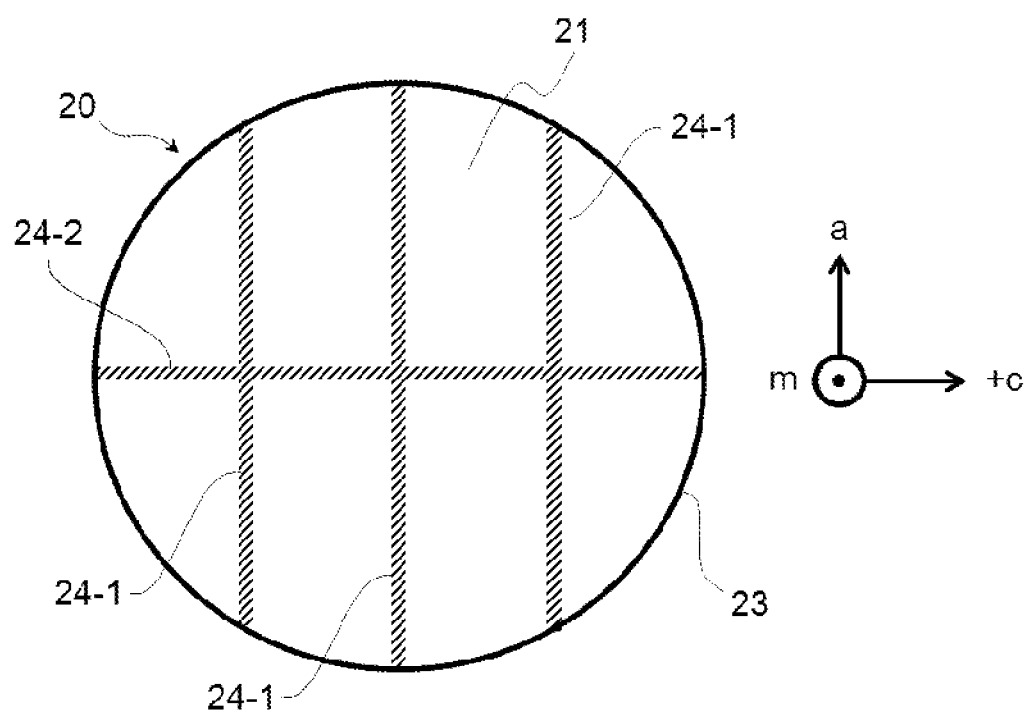
FIG. 3 is a plan view illustrating one example of the M-plane GaN wafer according to the first embodiment.

The GaN wafer according to the first embodiment may have, in addition to the lower-crystallinity band extending in a direction perpendicular to the c-axis, a lower-crystallinity band extending in a direction perpendicular to the a-axis on the first main surface. FIG. 3 is a plan view illustrating one example of such a GaN wafer.

Referring to FIG. 3, a GaN wafer 20 has a shape of a disk and has, in addition to lower-crystallinity bands 24-1 each extending in a direction perpendicular to the c-axis, a lower-crystallinity band 24-2 extending in a direction perpendicular to the a-axis on a first main surface 21. Preferably, the GaN wafer 20 has a diameter of from 95 to 155 mm.

The GaN wafer according to the first embodiment may be used as a substrate for producing various nitride semiconductor devices. Usually, one or more nitride semiconductors are grown by vapor phase epitaxy on the GaN wafer of the present invention to form a device structure. Preferably usable epitaxial growth methods include MOCVD methods, MBE methods, and pulse deposition methods, which are suitable for forming thin films.

Specific examples of the nitride semiconductor device include light emitting devices such as light emitting diodes and laser diodes, electronic devices such as rectifiers, bipolar transistors, field effect transistors, and HEMTs (High Electron Mobility Transistors), semiconductor sensors such as temperature sensors, pressure sensors, radiation sensors, and visible-ultraviolet light detectors, SAW (Surface Acoustic Wave) devices, vibrators, resonators, oscillators, MEMS (Micro Electro Mechanical System) components, voltage actuators, and solar cells.

2. Second Embodiment

A second embodiment of the present invention relates to a method for producing a non-polar or semi-polar GaN wafer.

The method for producing a non-polar or semi-polar GaN wafer according to the second embodiment includes the following steps 1 to 6.

Step 1: growing a GaN crystal in the [000-1] direction on the (000-1) surface of a C-plane GaN seed by an ammonothermal method.

Step 2: making an M-plane GaN seed from the GaN crystal grown in the [000-1] direction in Step 1 above.

Step 3: growing a bulk GaN crystal by an ammonothermal method on the M-plane GaN seed made in Step 2 above.

Step 4: making tiling GaN seeds from the bulk GaN crystal grown in Step 3 above.

Step 5: growing a bulk GaN crystal by a tiling method by using the tiling GaN seeds made in Step 4 above.

Step 6: making a non-polar or semi-polar GaN wafer having a desired surface orientation from the bulk GaN crystal grown in Step 5 above.

Details of the steps will be described below.

(Step 1)

In Step 1, used as the C-plane GaN seed is a conventional C-plane GaN wafer having a growth mask with a stripe pattern (line and space pattern) formed on the (000-1) surface (nitrogen polar surface) thereof by using a TiW alloy. The stripe direction of the growth mask is parallel to the a-axis of GaN, and openings of the growth mask each have a width of for example 100 µm. The growth mask is prevented from covering the side surface(s) of the C-plane GaN wafer.

As for a crystal growth apparatus and crystal growth conditions used in growing a GaN crystal by an ammonothermal method on the C-plane GaN seed, see WO2014/129544 and WO2015/020161.

By using appropriate conditions, on the (000-1) surface of the C-plane GaN seed, a GaN crystal grows at the position of each opening of the growth mask in the [000-1] direction to form a wall-like structure in which the c-axis direction is defined as the height direction and the m-axis direction is defined as the thickness direction.

For example, as a result of growth for a total of 100 days while replacing a growth vessel during the growth, the height of the wall (the size of the grown GaN crystal in the c-axis direction) can reach as high as 20 mm.

The growth of a GaN crystal also occurs on the side surface(s) of the C-plane GaN seed. GaN crystals grow from the entire side surface of the C-plane GaN seed and extend in the [000-1] direction to form a peripheral wall structure enclosing a plurality of the wall-like GaN crystals growing on the (000-1) surface of the seed.

(Step 2)

The GaN crystal grown in a wall-like shape on the (000-1) surface of the C-plane GaN seed in Step 1 above is removed from the seed and processed to provide an M-plane GaN seed. The M-plane GaN seed is a plate-like crystal having a main surface substantially parallel to the M-plane.

The main surfaces of the M-plane GaN seed are both subjected to planarization by lapping, followed by CMP finishing for removal of a damaged layer.

(Step 3)

On the M-plane GaN seed made in Step 2 above, a GaN crystal is grown by an ammonothermal method. The GaN crystal grows in a manner to cover an entire surface of the M-plane GaN seed. The growth direction of the GaN crystal on the main surface of the M-plane GaN seed is the m-axis direction.

(Step 4)

The GaN crystal grown in Step 3 above is sliced parallel to the M-plane, and edge portions of the obtained GaN crystal plate are cut off with a dicing saw to thereby make a tiling GaN seed which has rectangular main surfaces with long sides perpendicular to the c-axis and short sides perpendicular to the a-axis.

By adjusting the angle of slicing, the main surface of the tiling GaN seed may be slightly tilted from the M-plane.

Side surfaces of the tiling GaN seed are cut surfaces which are formed by cutting the GaN crystal plate with the dicing saw. A deviation of orientation of the side surface of the tiling GaN seed from a designed orientation can be kept within 0.1° by repeating the following operation: confirming, by an X-ray diffraction method, an orientation of a formed cut surface after every cutting; if a deviation from a designed orientation exceeds 0.1°, adjusting the direction of the work; and once again cutting the work.

When cutting the GaN crystal plate with the dicing saw, it is desirable to apply the saw blade from the side that serves as a back surface in subsequent Step 5. The back surface refers to the main surface on the opposite side of a front surface, when the front surface is the main surface on the side to be used for epitaxially growing a bulk GaN crystal among the two main surfaces of the tiling GaN seed (the same applies hereinafter).

Figure 13:
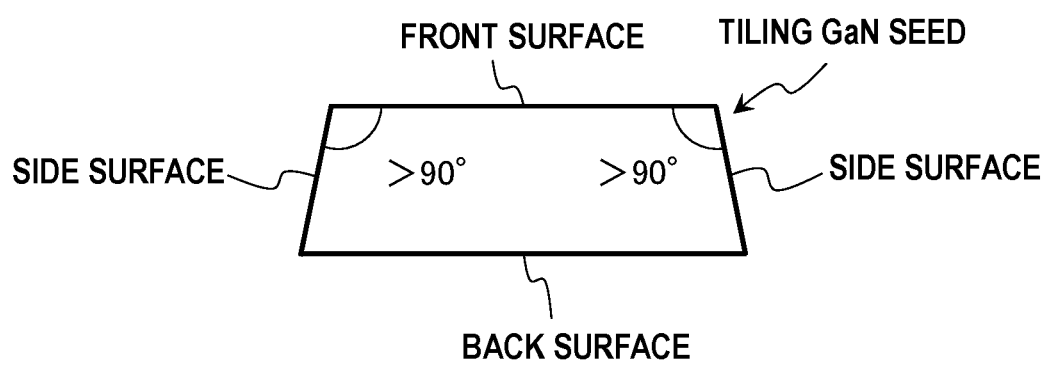
FIG. 13 illustrates a cross-sectional view of a tiling GaN seed in which angles each formed by the front surface and a side surface are obtuse angles (>90°).

The reason is for preventing the front surface and a side surface from forming an obtuse angle in the tiling GaN seed. Since a dicing saw has a blade which decreases in thickness toward the tip, when the blade is applied from the front surface side to cut the tiling GaN seed, an angle formed by the front surface and the side surface (cut surface) tends to be an obtuse angle (>90°) as shown in FIG. 13 in a cross-sectional view.

By setting the angle formed by the front surface and the side surface to be a right or acute angle, a gap between the front surfaces of adjacent tiling GaN seeds can be prevented from occurring when a plurality of the tiling GaN seeds are closely arranged side by side.

Usually, both main surfaces of the tiling GaN seed are subjected to planarization processing. Specifically, after grinding and/or lapping are performed, a damaged layer is removed by CMP.

Figure 4A:
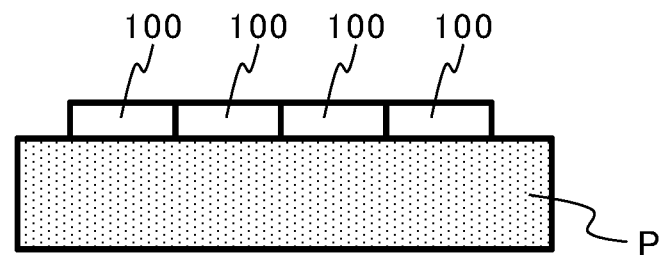
FIG. 4A is a cross-sectional view illustrating a state in which a plurality of tiling GaN seeds are adhered to a surface of a flat plate while being closely arranged side by side.
Figure 4B:
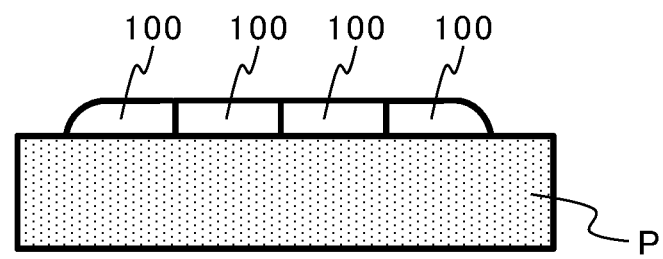
FIG. 4B is a cross-sectional view illustrating a state after the plurality of tiling GaN seeds illustrated in FIG. 4A are subjected to planarization processing.

The planarization processing is performed in the order of the back surface first, the front surface later (as described above, the front surface refers to the main surface on the side to be used for epitaxially growing a bulk GaN crystal in subsequent Step 5, and the back surface refers to the main surface on the opposite side). In particular, in planarization processing of the front surface, as shown in FIG. 4A in a cross-sectional view, a plurality of seeds 100 are fixed on a flat surface of a plate P while being closely arranged side by side (the back surfaces of the seeds are adhered to the plate P). As illustrated in FIG. 4B in a cross-sectional view, this allows, among the tiling GaN seeds 100 after planarization processing, variation in thickness to be extremely small, while suppressing edge roll-off of processed surfaces (front surfaces) in portions where the seeds are in contact with each other.

In particular, when the angle formed by the front surface and the side surface of the tiling GaN seed is set so as not to be an obtuse angle, in closely arranging side by side a plurality of the seeds and subjecting their front surfaces to planarization processing, a gap between the front surfaces of adjacent seeds is allowed to be small, and therefore the edge roll-off suppressing effect is preferably exerted.

(Step 5)

The plurality of tiling GaN seed each having the front surface that has been planarized while being closely arranged side by side on the flat surface of the plate, are closely arranged side by side on a susceptor of an HVPE apparatus in the same arrangement as when fixed on the plate, with the front surface facing upward, to thereby form an aggregated seed. On the aggregated seed, a bulk GaN crystal is epitaxially grown by an HVPE method (tiling method). It is preferable that carrier gas supplied to a reactor during growth of the bulk GaN crystal is nitrogen gas only.

Figure 5:
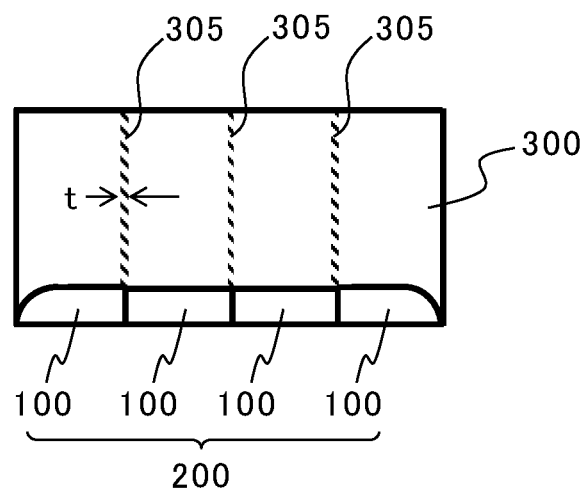
FIG. 5 illustrates a cross-sectional view of a composite of an aggregated seed and a bulk GaN crystal epitaxially grown on the aggregated seed.

FIG. 5 illustrates a cross sectional view of a composite of an aggregated seed 200 and a bulk GaN crystal 300 resulting from the epitaxial growth.

While the bulk GaN crystal 300 contains a lower-crystallinity portion 305 above the boundary between adjacent tiling GaN seeds 100, the thickness t of the portion is small, because the difference in surface orientation of the front surfaces of two tiling GaN seeds in the vicinity of the boundary is small. This is due to suppression of edge roll-off of the front surfaces in the vicinity of the boundary by subjecting the front surfaces to the planarization processing in the manner as described in Step 4.

In addition, for reducing the thickness of the lower-crystallinity portion caused in the bulk GaN crystal, it is also preferable to prevent the front surface and the side surface to form an obtuse angle in the tiling GaN seed, because the gap between the front surfaces of adjacent seeds in the aggregated seed is thereby allowed to be extremely small.

Figure 6:
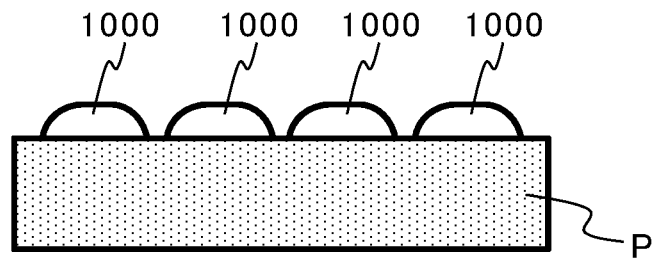
FIG. 6 is a cross-sectional view illustrating a state after a plurality of tiling GaN seeds have been adhered to a flat surface of a plate while being spaced apart from each other and have been subjected to planarization processing.

For comparison, a case will be described in which a plurality of tiling GaN seeds are fixed to a surface of a plate while being spaced apart from each other, and subjected to planarization processing of front surfaces. In this case, as illustrated in a cross-sectional view in FIG. 6, edge roll-off of the front surfaces of tiling GaN seeds 1000 is not suppressed.

Figure 7:
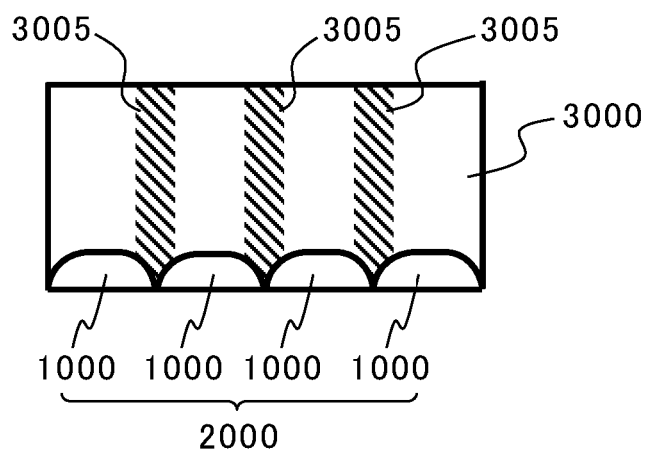
FIG. 7 illustrates a cross-sectional view of a composite of an aggregated seed and a bulk GaN crystal epitaxially grown on the aggregated seed.

FIG. 7 illustrates a cross-sectional view of a composite of an aggregated seed and a bulk GaN crystal epitaxially grown thereon which is obtained when the aggregated seed is configured with such tiling GaN seeds each having a large edge roll-off amount and a tiling method is performed.

Referring to FIG. 7, the bulk GaN crystal 3000 grown on the aggregated seed 2000 made of a plurality of the tiling GaN seeds 1000 contains thick lower-crystallinity portions 3005 above the boundaries between adjacent tiling GaN seeds.

(Step 6)

By slicing the bulk GaN crystal obtained in Step 5 above, a non-polar or semi-polar GaN wafer is obtained. The direction of slicing may be parallel to or may be tilted relative to the front surfaces of the tiling GaN seeds.

Main surfaces of the GaN wafer are subjected to planarization processing. Specifically, after grinding and/or lapping are performed, a damaged layer is removed by CMP.

Figure 8:
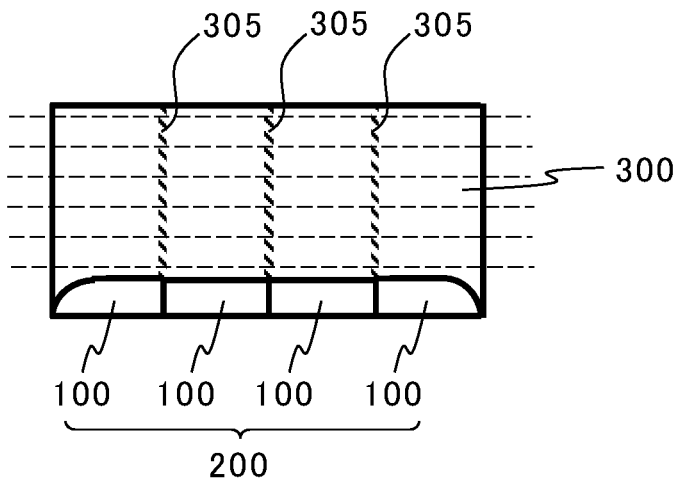
FIG. 8 is a cross sectional-view of the composite illustrated in FIG. 5 after being processed to have a cylindrical shape, and broken lines indicate positions of slicing when slicing the composite to obtain the GaN wafer illustrated in FIG. 1.

For example, by processing the composite illustrated in FIG. 5 into a cylindrical shape through outer periphery grinding or core drilling and subsequently slicing the processed composite at positions indicated by broken lines in FIG. 8, the GaN wafer 10 illustrated in FIG. 1 is obtained. The lower-crystallinity portions 305 in the bulk GaN crystal 300 are thereby exposed on the main surface 11 of the GaN wafer 10 and form the lower-crystallinity bands 14.

3. Experimental Results 3.1. Example

A C-plane GaN wafer was prepared, and on its (000-1) surface (nitrogen polar surface), a growth mask with a stripe pattern was formed by using a TiW alloy. The stripe direction was parallel to the a-axis of GaN, and the openings each had a width of 100 μm.

On the (000-1) surface of the C-plane GaN wafer having such a growth mask formed thereon, a GaN crystal was grown by an ammonothermal method. Polycrystalline GaN was used as a feedstock, and ammonium fluoride ($NH_4F$) and ammonium iodide ($NH_4I$) were used as mineralizers.

Amounts of charge of the mineralizers were determined so that $NH_4F$ and $NH_4I$ were from 0.5 to 1.5% and from 1.5 to 3.5%, respectively, in terms of molar ratio to $NH_3$ sealed in a growth vessel and that molar ratio of $NH_4F$ to $NH_4I$ was from 0.2 to 0.5.

Growth conditions were as follows: the average temperature in the growth vessel (the average value of the temperature in a crystal growth zone and the temperature in a feedstock dissolution zone) was from 590 to 630° C.; the temperature difference between the crystal growth zone and the feedstock dissolution zone was from 5 to 20° C.; and the pressure inside the growth vessel was from 200 to 220 MPa.

As a result of growth for a total of 100 days while replacing the growth vessel twice during the growth, at the position of each opening of the growth mask, a wall-like GaN crystal in which the c-axis direction was defined as the height direction and the m-axis direction was defined as the thickness direction was grown.

The GaN crystal grown like a wall was removed from the C-plane GaN wafer and processed into a flat plate having a main surface substantially parallel to the M-plane (M-plane GaN seed). The main surfaces of the M-plane GaN seed were both subjected to planarization by lapping, followed by CMP finishing for removal of a damaged layer.

Next, on this M-plane GaN seed, a GaN crystal was grown by an ammonothermal method again. In this second ammonothermal growth, amounts of charge of the mineralizers were set so that fluorine atoms and iodine atoms were 0.5% and 1.5%, respectively, in terms of molar ratio to $NH_3$. The average temperature in the growth vessel was from 600 to 611° C., and the temperature difference between the crystal growth zone and the feedstock dissolution zone was from 9 to 13° C. The pressure inside the growth vessel was the same as that in the first ammonothermal growth.

From the GaN crystal grown by the second ammonothermal growth on the M-plane GaN seed, a tiling GaN seed having a plate-shape and a thickness of about 330 μm was made in the following procedure.

First, the GaN crystal was sliced parallel to the M-plane with a multi-wire saw. Subsequently, edge portions of a GaN crystal plate sliced were cut off with a dicing saw to shape the main surface of the GaN crystal plate into a rectangle with long sides parallel to the a-axis and short sides perpendicular to the a-axis. In cutting with the dicing saw, the saw blade was always applied to the GaN crystal plate from the back surface side. For any of the long sides and the short sides of the rectangle, a deviation from a designed orientation was set to 0.1° or less.

Finally, each main surface of the GaN crystal plate was subjected to planarization processing to complete a tiling GaN seed. Specifically, after grinding and/or lapping were performed, a damaged layer was removed by CMP.

The order of the planarization processing was the back surface first, the front surface later. The front surface is the main surface on the side to be used later for epitaxially growing a bulk GaN crystal by an HVPE method.

The planarization processing of the front surface was carried out in a state where five GaN crystal plates were adhered with wax to a flat surface of a plate while being closely arranged side by side in the c-axis direction. More specifically, the five GaN crystal plates were aligned in a row on the flat surface of the plate such that between any two neighboring GaN crystal plates, the [0001] side end of one plate and the [000-1] side end of the other plate are in contact with each other, thereby making the [0001] directions of all the five GaN crystal plates identical.

Next, the five tiling GaN seeds, which had been obtained by planarizing their front surfaces in the state where they were arranged closely side by side, were closely arranged on a susceptor of an HVPE apparatus, with the front surface facing upward, to thereby form an aggregated seed. The arrangement of the five seeds in the aggregated seed was the same as that in the planarization processing of the front surfaces.

On this aggregated seed, a bulk GaN crystal was epitaxially grown by an HVPE method. The growth temperature was 1050° C., and the growth time was 82 hours. Carrier gas supplied to a reactor during growth of the bulk GaN crystal was nitrogen gas only.

The grown bulk GaN crystal was processed into a cylindrical shape together with the seeds, and subsequently sliced into wafers. The direction of slicing was adjusted such that the main surface of the wafer was tilted relative to the M-pane by 5° in the [000-1] direction. After slicing, both main surfaces of the wafer were subjected to planarization processing to thereby provide an off-angled M-plane GaN wafer having a diameter of 50 mm and a thickness of 280 μm and having four lower-crystallinity bands each extending on the main surface in a direction perpendicular to the c-axis.

Among the off-angled M-plane GaN wafers of the Example made following the above-described procedure, one wafer was selected, and X-rays (CuKα rays) were allowed to enter the main surface of the selected wafer to measure full width at half maximums of X-ray rocking curve (XRC-FWHMs) of the (100) plane. The selected wafer was cut out from the bulk GaN crystal at a part about 5 mm distant from the seed surfaces.

The measurement was carried out using a high-resolution X-ray diffractometer (PAnalytical X'Pert PRO MRD) equipped with an X-ray mirror and a Ge (220) 2-crystal hybrid monochromator in an incident optics. The incident direction of X-rays was perpendicular to the c-axis of the M-plane GaN wafer. A ⅟₃₂ divergence slit and a 0.05 mm vertical limitation slit were used on the incidence side.

By capturing intensity data with the use of a semiconductor pixel detector for an ω range of 0.4° at every step of 0.001° for an accumulated time of 10 seconds, it was possible to obtain an XRC-FWHM at about every 27 μm on a measurement line extending on the main surface of the wafer in the c-axis direction and having a length of about 7 mm. The semiconductor pixel detector used was PIXcel$^{3D}$® from PANalytical and configured to include a pixel array in which 256 pixels were arranged side by side in a row at a pitch of 55 μm.

Figure 9A:
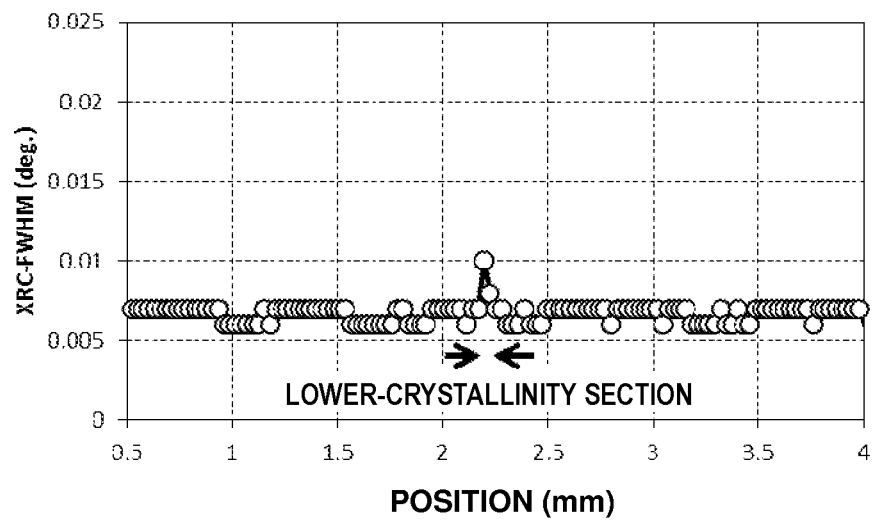
FIGS. 9A to 9C are graphs each showing the result of measurement of an XRC-FWHM of the (100) plane at about every 27 μm on a measurement line extending on a main surface of an M-plane GaN wafer of an Example in the c-axis direction.
Figure 9B:
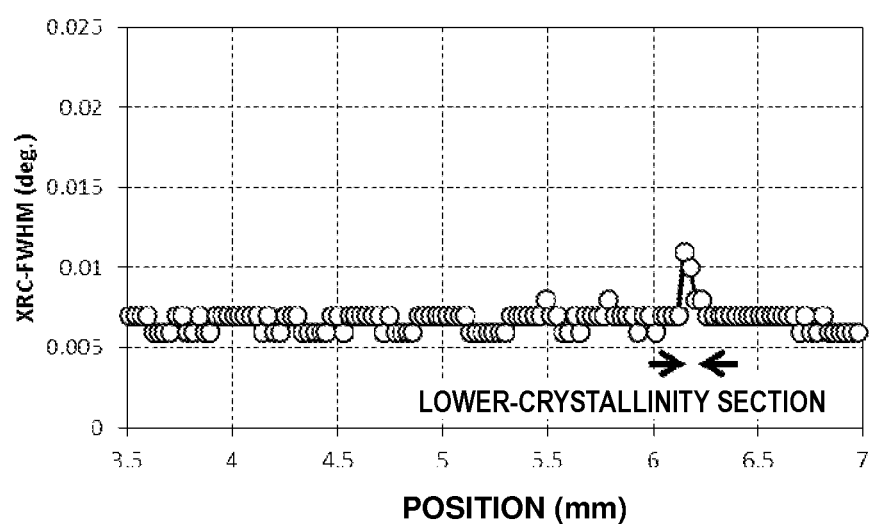
Figure 9C:
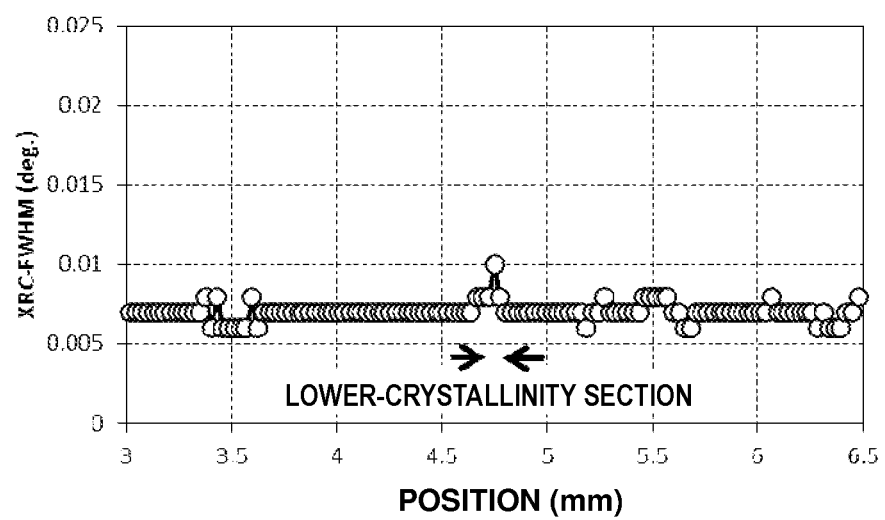

FIGS. 9A to 9C each illustrate XRC-FWHMs obtained at about every 27 μm on a measurement line selected to cross a lower-crystallinity band at a right angle. FIGS. 9A to 9C illustrate respective results obtained on different measurement lines. In FIGS. 9A to 9C, the horizontal axes indicate relative positions on the measurement line (unit: mm), while the vertical axes indicate XRC-FWHMs (unit: °) on the (100) plane.

In all of FIGS. 9A to 9C, XRC-FWHMs on the measurement lines were 0.008° or less (approximately within a range of from 0.006 to 0.007°), except in sections indicated as "lower-crystallinity section" in the graphs. In the lower-crystallinity sections, XRC-FWHMs locally increase to 0.01° or more.

Separately performed CL image observation showed that respective lower-crystallinity sections in FIGS. 9A to 9C each corresponded to a portion where the measurement line crossed the lower-crystallinity band. It can therefore be said that the section length of the lower-crystallinity section is the width of the lower-crystallinity band.

In each of FIGS. 9A to 9C, the lower-crystallinity section had a section length of less than 60 μm.

3.2 Comparative Example

In a Comparative Example, the following four points were changed from the Example.

Firstly, the number of the tiling GaN seeds used was four.

Secondly, in subjecting the front surfaces of the four tiling GaN seeds to planarization processing, the four seeds were fixed to the surface of the plate while being spaced apart from each other.

Thirdly, growth time of the bulk GaN crystal by the HVPE method was 61 hours.

Fourthly, in slicing the bulk GaN crystal, the direction of slicing was adjusted such that the main surface of the wafer was tilted relative to the M-plane by 2° in the [000-1] direction.

Except for the above four points of change, off-angled M-plane GaN wafers of the Comparative Example were made in the same manner as in the Example.

One wafer was selected from the wafers made, and by using the same measurement method as in the Example, XRC-FWHMs on the (100) plane at about every 27 μm on a measurement line extending on the main surface of the wafer in the c-axis direction was obtained. The selected wafer was cut out from the bulk GaN crystal at a part about 0.2 mm distant from the seed surfaces.

Figure 10A:
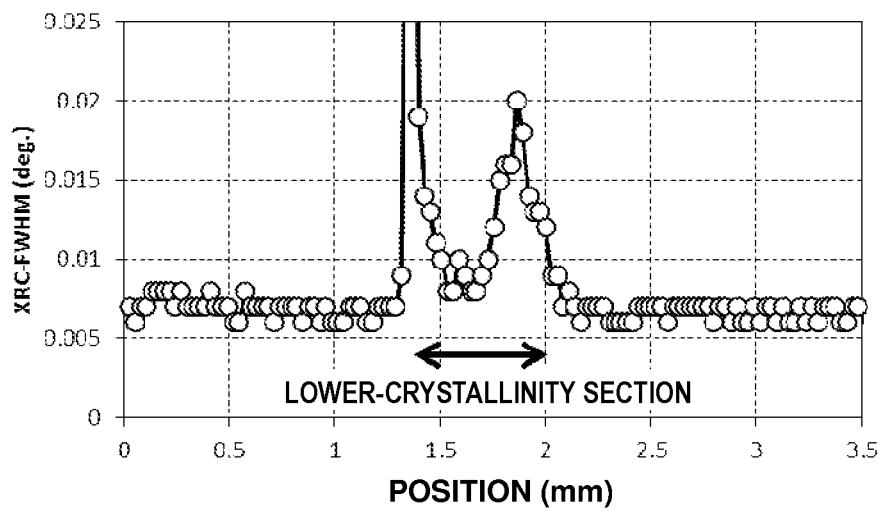
FIGS. 10A to 10C are graphs each showing the result of measurement of an XRC-FWHM of the (100) plane at about every 27 μm on a measurement line extending on a main surface of an M-plane GaN wafer of a Comparative Example in the c-axis direction.
Figure 10B:
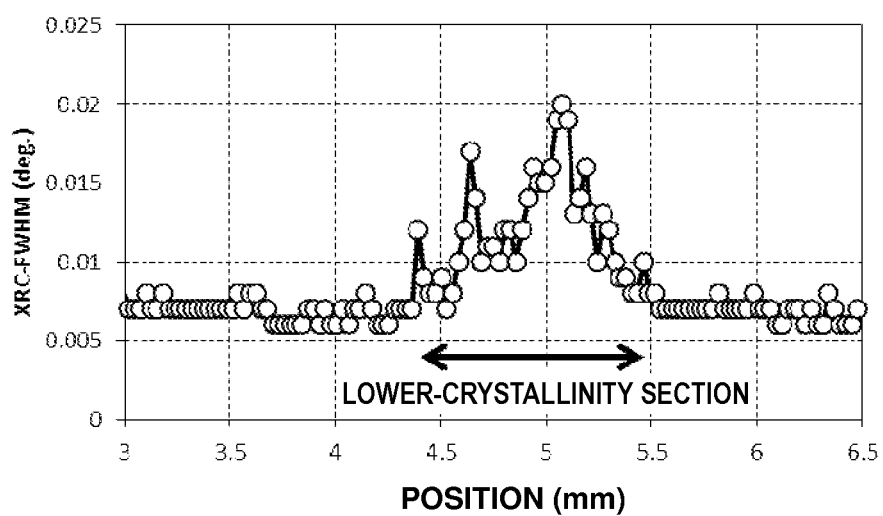
Figure 10C:
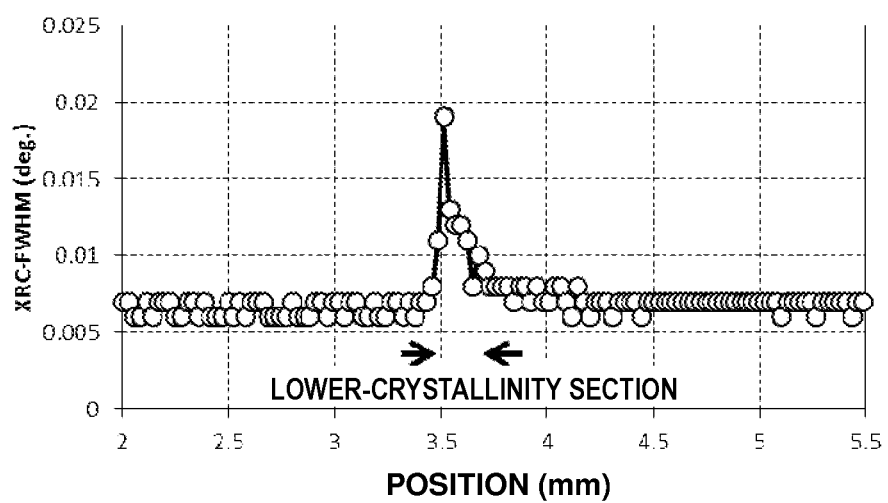

FIGS. 10A to 10C each illustrate XRC-FWHMs on the (100) plane obtained at about every 27 μm on a measurement line selected to cross a lower-crystallinity band at a right angle. FIGS. 10A to 10C illustrate respective results obtained on different measurement lines. In FIGS. 10A to 10C, the horizontal axes and the vertical axes indicate the same values as in FIGS. 9A to 9C.

In all of FIGS. 10A to 10c, XRC-FWHMs on the measurement lines were 0.008° or less (approximately within a range of from 0.006 to 0.007°), except in sections indicated as "lower-crystallinity section" in the graphs. The lower-crystallinity sections include portions where XRC-FWHMs increased to 0.01° or more.

Separately performed CL image observation showed that respective lower-crystallinity sections in FIGS. 10A to 10C each corresponded to a portion where the measurement line crossed the lower-crystallinity band. The lower-crystallinity section had a section length of 660 μm in FIG. 10A, 1070 μm in FIG. 10 B, and 190 μm in FIG. 10C.

In FIGS. 10A to 10C, even in the lower-crystallinity sections, portions where XRC-FWHMs are less than 0.01° are locally found. In other words, in lower-crystallinity bands, small areas where crystal orientation is not disarranged exist in some places. However, since such small areas are mixed with areas where crystal orientation is significantly disarranged, it is considered difficult to effectively utilize such small areas for forming semiconductor devices.

Although the present invention has been described with reference to specific embodiments as above, each embodiment was presented as an example and does not limit the scope of the present invention. That is to say, each of the embodiments described herein can be variously modified without departing from the spirit of the invention, and can be combined with characteristics described by other embodiments so long as it can be enabled.

REFERENCE SIGNS LIST 10, 20, 30 GaN wafer
11, 21 first main surface
12 second main surface
13, 23 side surface
14, 24-1, 24-2 lower-crystallinity band
16 main surface
17 measurement line
100, 1000 tiling GaN seed
200, 2000 aggregated seed
300, 3000 bulk GaN crystal
15, 305, 3005 lower-crystallinity portion
400 X-ray source
405 X-rays
500 semiconductor pixel detector 505 one-dimensional pixel array
P plate

The invention claimed is:

1. A method for producing a GaN crystal, comprising:
planarizing front surfaces of a plurality of tiling GaN seeds arranged side by side on a surface of a plate to produce a plurality of planarized tiling GaN seeds;
forming an aggregated seed by arranging the plurality of planarized tiling GaN seeds side by side on a susceptor of an HVPE apparatus in the same arrangement as when arranged on the plate during planarizing, with the front planarized surfaces facing upward; and
growing a bulk GaN crystal epitaxially on the aggregated seed by an HVPE method.

2. The method for producing a GaN crystal according to claim 1, wherein
an angle formed by the front surface and a side surface of the tiling GaN seed is not an obtuse angle.

3. The method for producing a GaN crystal according to claim 1, wherein
back surfaces of the tiling GaN seeds are planarized prior to the planarizing of the front surfaces of the tiling GaN seeds.

4. The method for producing a GaN crystal according to claim 1, wherein
the plurality of tiling GaN seeds are made of a GaN crystal grown by an ammonothermal method.

5. The method for producing a GaN crystal according to claim 1, wherein
the front surfaces of the plurality of tiling GaN seeds are parallel to an M-plane or slightly tilted from the M-plane.

6. The method for producing a GaN crystal according to claim 5, wherein
the plurality of tiling GaN seeds have rectangular main surfaces with long sides perpendicular to a c-axis and short sides perpendicular to an a-axis.

7. A method for producing a GaN wafer, comprising:
slicing the GaN crystal produced by the method according to claim 1.

8. A method for producing a non-polar or semi-polar GaN wafer, comprising:
slicing the GaN crystal produced by the method according to claim 5.

* * * * *